(12) United States Patent
Chen et al.

(10) Patent No.: US 12,696,772 B2
(45) Date of Patent: Jul. 28, 2026

(54) CHIP PACKAGE STRUCTURE

(71) Applicant: TONG HSING ELECTRONIC INDUSTRIES, LTD., Taipei City (TW)

(72) Inventors: Yan-Wei Chen, Taipei City (TW); Chih-Jen Su, Taipei City (TW)

(73) Assignee: TONG HSING ELECTRONIC INDUSTRIES, LTD., Taipei City (TW)

( * ) Notice: Subject to any disclaimer, the term of this patent is extended or adjusted under 35 U.S.C. 154(b) by 371 days.

(21) Appl. No.: 18/517,454

(22) Filed: Nov. 22, 2023

(65) Prior Publication Data

US 2025/0079267 A1     Mar. 6, 2025

(30) Foreign Application Priority Data

Aug. 31, 2023   (TW) ................................. 112132957

(51) Int. Cl.
    *H10W 70/40*        (2026.01)
    *H10W 90/00*        (2026.01)
(52) U.S. Cl.
    CPC ....... *H10W 70/415* (2026.01); *H10W 70/461* (2026.01); *H10W 70/465* (2026.01); *H10W 90/00* (2026.01); *H10W 90/722* (2026.01); *H10W 90/724* (2026.01); *H10W 90/792* (2026.01); *H10W 90/796* (2026.01)
(58) Field of Classification Search
    CPC ..... H10W 70/424–438; H10W 70/468; H10W 70/479
    See application file for complete search history.

(56) References Cited

U.S. PATENT DOCUMENTS

| | | | |
|---|---|---|---|
| 9,881,862 B1 | 1/2018 | Otremba et al. | |
| 11,239,127 B2 | 2/2022 | Myers et al. | |
| 2007/0210443 A1* | 9/2007 | Merilo ................ | H01L 23/3128 |
| | | | 257/E23.126 |
| 2009/0230517 A1* | 9/2009 | Bathan .............. | H01L 23/49575 |
| | | | 438/109 |
| 2010/0193942 A1* | 8/2010 | Railkar .............. | H01L 23/4334 |
| | | | 257/713 |
| 2019/0109064 A1* | 4/2019 | Kao .................... | H01L 23/3731 |
| 2020/0411419 A1* | 12/2020 | Hatori ................ | H10W 70/421 |
| 2021/0183751 A1 | 6/2021 | Clemente et al. | |
| 2023/0038411 A1 | 2/2023 | Shibuya | |

FOREIGN PATENT DOCUMENTS

| | | | | |
|---|---|---|---|---|
| CN | 109148411 B | * | 6/2020 | ......... H01L 21/4882 |
| CN | 111710668 A | | 9/2020 | |

* cited by examiner

*Primary Examiner* — Evan G Clinton
(74) *Attorney, Agent, or Firm* — Li & Cai Intellectual Property (USA) Office

(57)        ABSTRACT

A chip package structure includes a circuit substrate, a lead frame, a first chip, a second chip, a connecting member, and a package body. The lead frame is stacked on the circuit substrate, and the lead frame is bent to form an accommodating space. The first chip is disposed on the lead frame and located in the accommodating space. The second chip is disposed on the circuit substrate and located in the accommodating space. The connecting member is used to connect the lead frame and the circuit substrate. The package body is disposed on the circuit substrate and covers the first chip, the second chip, and the lead frame.

13 Claims, 12 Drawing Sheets

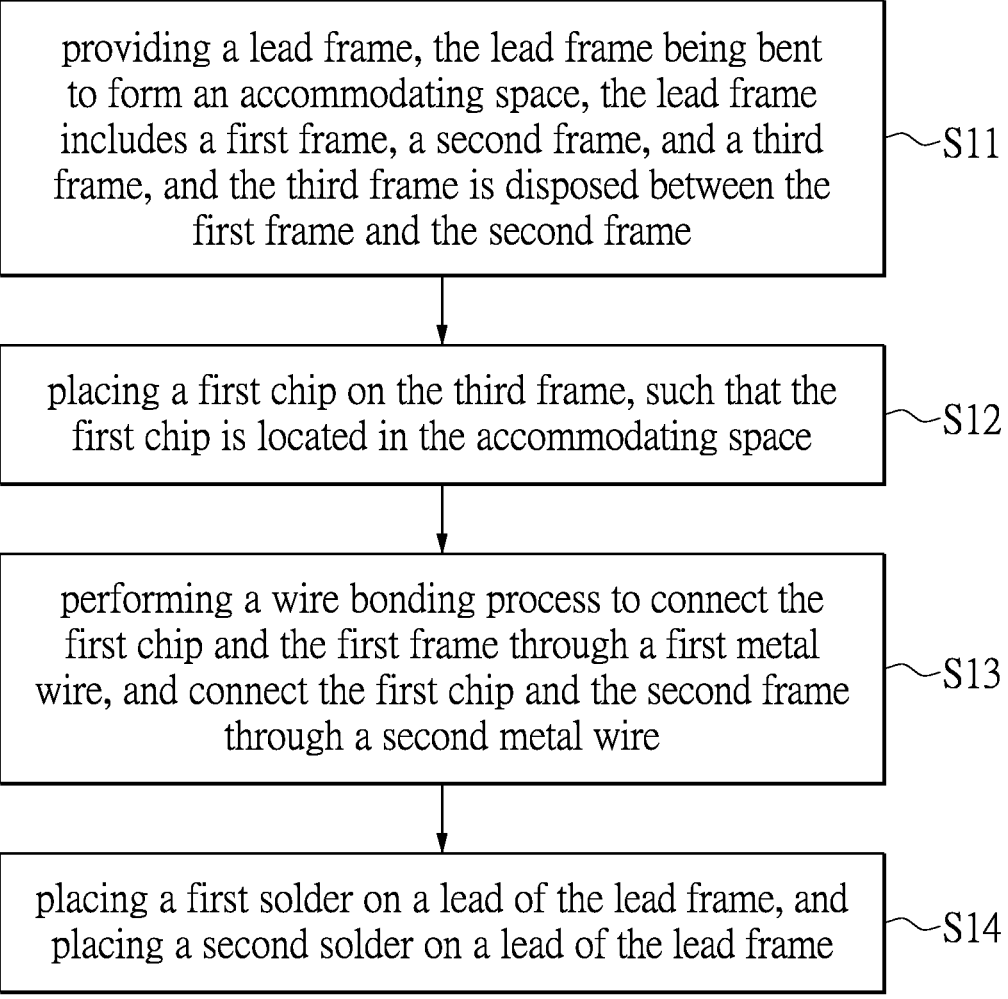

providing a lead frame, the lead frame being bent to form an accommodating space, the lead frame includes a first frame, a second frame, and a third frame, and the third frame is disposed between the first frame and the second frame ~S11 placing a first chip on the third frame, such that the first chip is located in the accommodating space ~S12 performing a wire bonding process to connect the first chip and the first frame through a first metal wire, and connect the first chip and the second frame through a second metal wire ~S13 placing a first solder on a lead of the lead frame, and placing a second solder on a lead of the lead frame ~S14

FIG. 11 providing a circuit substrate, the circuit substrate being disposed on the lead frame, the circuit substrate includes a first metal pad, a second metal pad, and a third metal pad, the first solder is used to connect the first frame and the first metal pad, the second solder is used to connect the second frame and the second metal pad, and a second chip is placed on the third metal pad ~S15 providing a package body, the package body being disposed on the circuit substrate and covering the first chip, the second chip, and the lead frame ~S16

FIG. 12

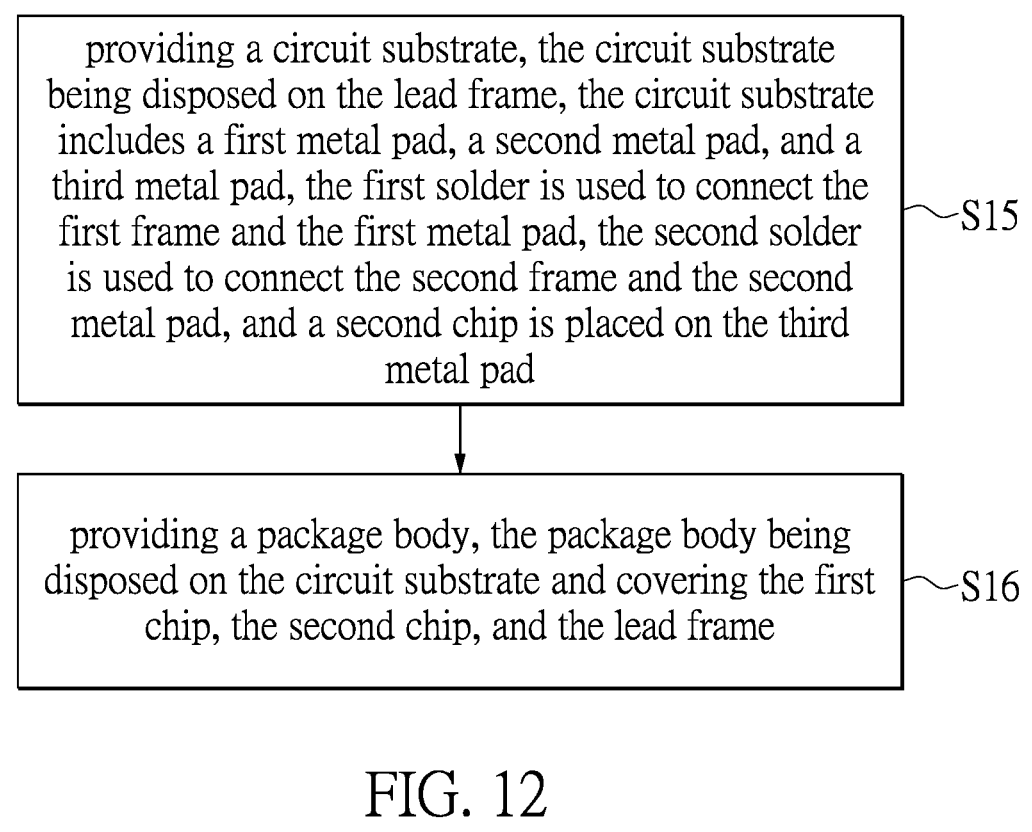

CHIP PACKAGE STRUCTURE

CROSS-REFERENCE TO RELATED PATENT APPLICATION

This application claims the benefit of priority to Taiwan Patent Application No. 112132957, filed on Aug. 31, 2023. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a chip package structure, and more particularly to a chip package structure applied to a power module.

BACKGROUND OF THE DISCLOSURE

A power module is a surface mount power device package (SMPD package) structure, which is formed by integrating multiple power IC components into a package structure. In the related art, the power module and the power IC components are jointly bonded on a same plane of a carrier for integration and collaborative operation. However, often are other active and passive components, as well as peripheral leads, also bonded on the carrier. Therefore, the way that all of the electronic components are integrated on the same plane causes difficulties in circuit layout and heat dissipation, which results in low operating efficiency.

Therefore, how to overcome the above-mentioned problem through an improvement in structural design has become an important issue to be addressed in the related art.

SUMMARY OF THE DISCLOSURE

In response to the above-referenced technical inadequacy, the present disclosure provides a chip package structure, so as to address problems stemming from having multiple electronic components integrated to a same plane of a carrier that lead to difficulties in routing and heat-dissipation.

In order to solve the above-mentioned problems, one of the technical aspects adopted by the present disclosure is to provide a chip package structure, which includes a circuit substrate, a lead frame, a first chip, a second chip, a connecting member, and a package body. The lead frame is stacked on the circuit substrate, and the lead frame is bent to form an accommodating space. The first chip is disposed on the lead frame and located in the accommodating space. The second chip is disposed on the circuit substrate and located in the accommodating space. The connecting member is connected to the lead frame and the circuit substrate. The package body is disposed on the circuit substrate and covers the first chip, the second chip, and the lead frame.

Therefore, in the chip package structure provided by the present disclosure, by virtue of "the lead frame being stacked on the circuit substrate," "the first chip being disposed on the lead frame," and "the second chip being disposed on the circuit substrate," the lead frame and the circuit substrate can be vertically integrated and stacked for packaging, such that different chips are placed on different carriers (i.e., the lead frame and the circuit substrate), thereby reducing a planar size of the chip package structure and decreasing the difficulty of wire-routing on the circuit substrate, and improving the heat-dissipation efficiency.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which:

FIG. 11 and FIG. 12 are flowcharts showing the method of manufacturing the sensor package structure according to the present disclosure.

DETAILED DESCRIPTION OF THE EXEMPLARY EMBODIMENTS

Figure 1:
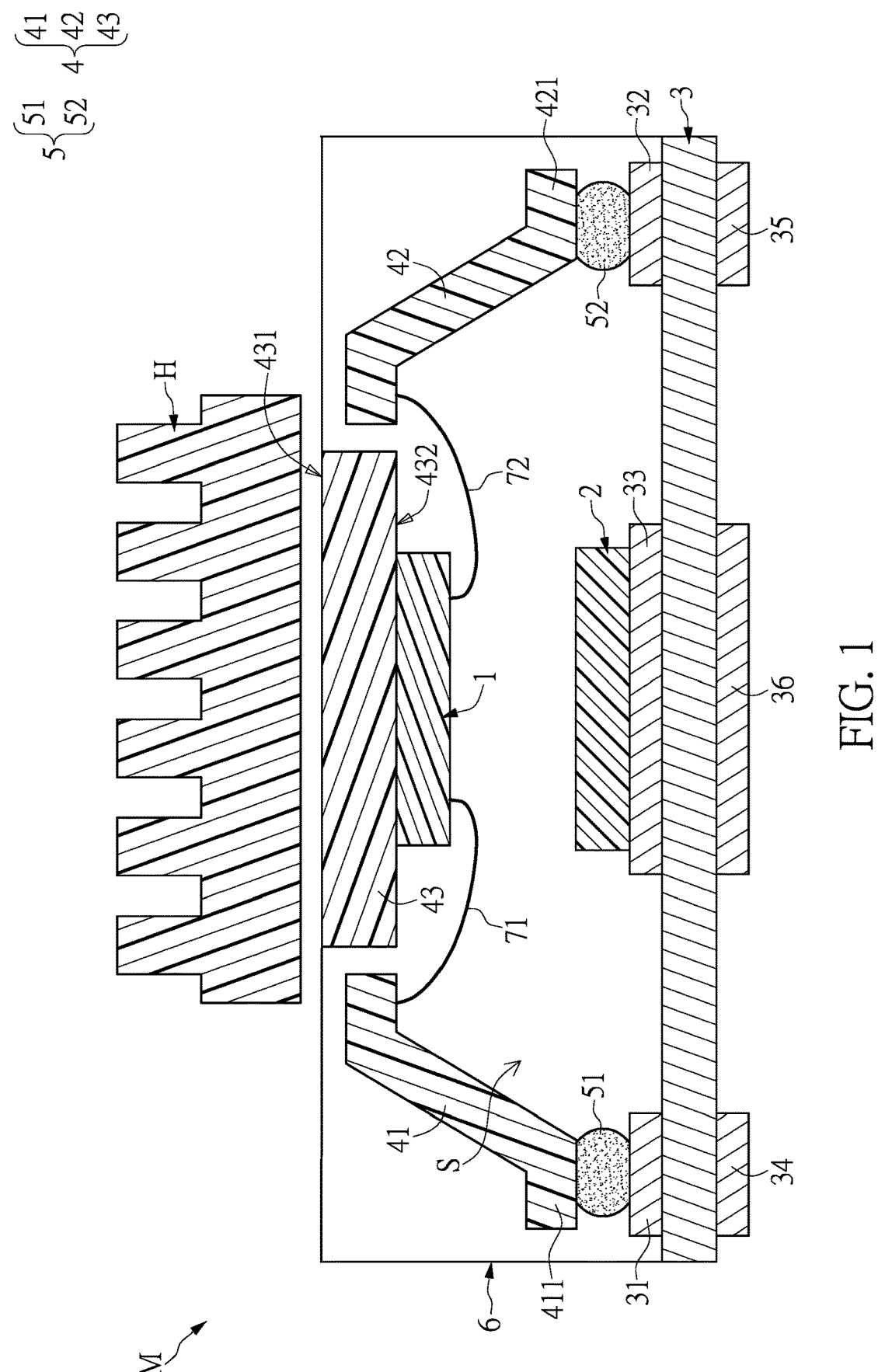
FIG. 1 is a schematic view of a chip package structure according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

Referring to FIG. 1, FIG. 1 is a schematic view of a chip package structure according to a first embodiment of the present disclosure. The first embodiment of the present disclosure provides a chip package structure M, which includes a first chip 1, a second chip 2, a circuit substrate 3, a lead frame 4, a connecting member 5, and a package body 6. The lead frame 4 is stacked on the circuit substrate 3, and the lead frame 4 is bent to form an accommodating space S. The first chip 1 is disposed on the lead frame 4 and located in the accommodating space S. The second chip 2 is disposed on the circuit substrate 3. The lead frame 4 covers the second chip 2, and the second chip 2 is located in the accommodating space S. In other words, the first chip 1 and the second chip 2 are both located in the accommodating space S that is formed between the lead frame 4 and the circuit substrate 3. The connecting member 5 is connected to the lead frame 4 and the circuit substrate 3. The package body 6 is disposed on the circuit substrate 3, and covers the first chip 1, the second chip 2, and the lead frame 4. More specifically, the package body 6 not only covers an outside of the lead frame 4, but also fills up the accommodating space S inside the lead frame 4, and covers the first chip 1 and the second chip 2.

In the present disclosure, the first chip 1 that is disposed on the lead frame 4 is a power integrated circuit (power IC) chip, such as a power chip made of GaN. The second chip 2 that is disposed on the circuit substrate 3 is a driver integrated circuit (driver IC) chip. In addition, for example, the circuit substrate 3 is laminated printed circuit board (laminated PCB) structure. The material of the circuit substrate 3 can include, but is not limited to, ceramic, and the package body 6 can be a molding compound.

The lead frame 4 includes a first fame 41, a second frame 42, and a third frame 43. The third frame 43 is disposed between the first frame 41 and the second frame 42. The third frame 43 has an outer surface 431 and an inner surface 432. The first chip 1 is disposed on the inner surface 432. When the package body 6 covers the outside of the lead frame 4, the outer surface 431 is exposed from the package body 6; that is, the outer surface 431 is not covered by the package body 6.

An upper surface and a lower surface of the circuit substrate 3 include a plurality of metal pads, and the metal pads on the upper surface are electrically connected to the metal pads on the lower surface. As shown in FIG. 1, the metal pads on the upper surface includes a first metal pad 31, a second metal pad 32, and a third metal pad 33, and the metal pads on the lower surface includes a fourth metal pad 34, a fifth metal pad 35, and a sixth metal pad 36. A quantity of the metal pads is not limited in the present disclosure. The second chip 2 is disposed on the third metal pad 33, and the third metal pad 33 is located between the first metal pad 31 and the second metal pad 32. The connecting member 5 includes a first solder 51 and a second solder 52. When the lead frame 4 is stacked on the circuit substrate 3, the first solder 51 is connected to the first frame 41 and the first metal pad 31, and the second solder 52 is connected to the second frame 42 and the second metal pad 32. In FIG. 1, the first solder 51 and the second solder 52 can be made of tin (Sn).

The chip package structure M further includes a first metal wire 71 and a second metal wire 72. The first metal wire 71 is used to connect the first chip 1 and the first frame 41, and the second metal wire 72 is used to connect the first chip 1 and the second frame 42. Moreover, the first metal wire 71 and the second metal wire 72 are further covered by the package body 6 to prevent the first metal wire 71 and the second metal wire 72 from short-circuiting because of electrical conduction generated between the first metal wire 71 and the second metal wire 72, or between the metal wires and other electronic components.

In the present disclosure, by stacking the lead frame 4 on the circuit substrate 3, the lead frame 4 and the circuit substrate 3 are vertically integrated to form a stacked structure. Through the stacked structure, different chips are disposed on different carriers. For example, the first chip 1 is disposed on the lead frame 4, and the second chip 2 is disposed on the circuit substrate 3, such that a planar size of the chip package structure M can be reduced. Furthermore, the first chip 1 (power IC chip) and the second chip 2 (driver IC chip) can jointly form a co-package structure through the design of the stacked structure, which can lower the gate-loop inductance and the source inductance in the first chip 1 and the second chip 2 and improve the operating efficiency of the components. The second chip 2 serving as a driver IC chip requires multiple circuit traces, and has a high complexity in circuit layout. Therefore, by disposing the second chip 2 on the circuit substrate 3, the need for a larger circuit layout area can be satisfied. The first chip 1 serving as a power IC chip generates a lot of heat energy because of large current transmission. Therefore, by disposing the first chip 1 on the lead frame 4, the need for high heat dissipation efficiency can be satisfied. Moreover, the heat dissipation efficiency of the chip package structure M provided by the present disclosure can be further improved by disposing the first chip 1 on the inner surface 432 of the third frame 43 and providing an external heat dissipation sink H to contact the exposed outer surface 431 of the third frame 43.

Second Embodiment

Figure 2:
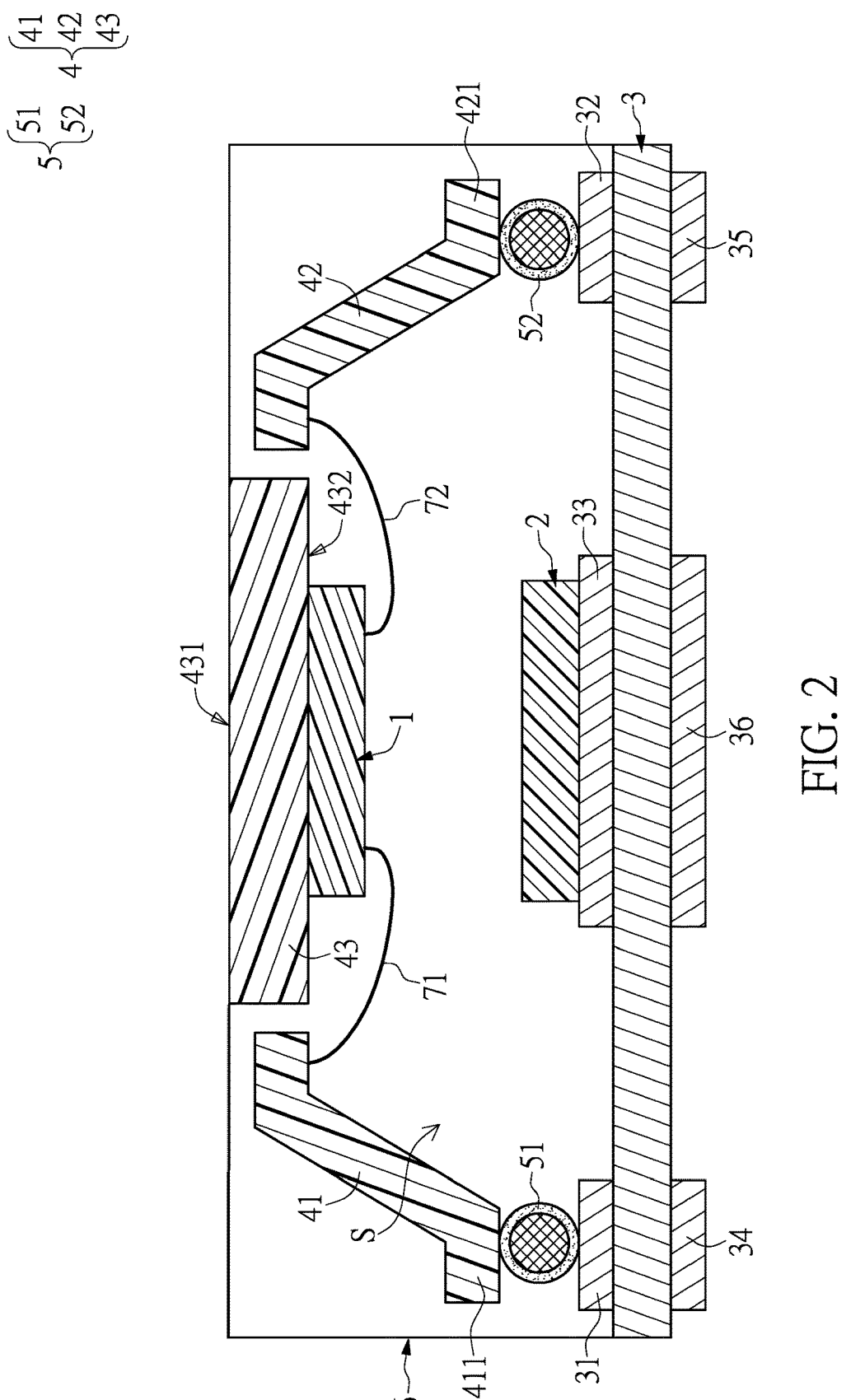
FIG. 2 is a schematic view of a chip package structure according to a second embodiment of the present disclosure.

Referring to FIG. 2, FIG. 2 is a schematic view of a chip package structure according to a second embodiment of the present disclosure. The second embodiment of the present disclosure provides a chip package structure M, which includes a first chip 1, a second chip 2, a circuit substrate 3, a lead frame 4, a connecting member 5, and an package body 6. The chip package structure M in the second embodiment has a structure similar to that of the chip package structure M in the first embodiment, and the similarities therebetween will not be reiterated herein. The main difference between the second embodiment and the first embodiment resides in the structure of the connecting member 5; more specifically, the first solder 51 and the second solder 52 have different structural compositions.

In the first embodiment, the first solder 51 and the second solder 52 are made of tin. However, in the second embodiment, the first solder 51 and the second solder 52 are made of copper core solder balls. Each of the copper core solder balls is a composite structure composed of a copper ball as the core and a tin plating layer on the periphery. Through the design of the first solder 51 and the second solder 52 as copper core solder balls, the amount of tin between the circuit substrate 3 and the lead frame 4 can be accurately controlled to ensure that heights on both sides of the lead frame 4 are consistent and avoid tilt caused by uneven tin quantity on either side of the lead frame 4.

Third Embodiment

Figure 3:
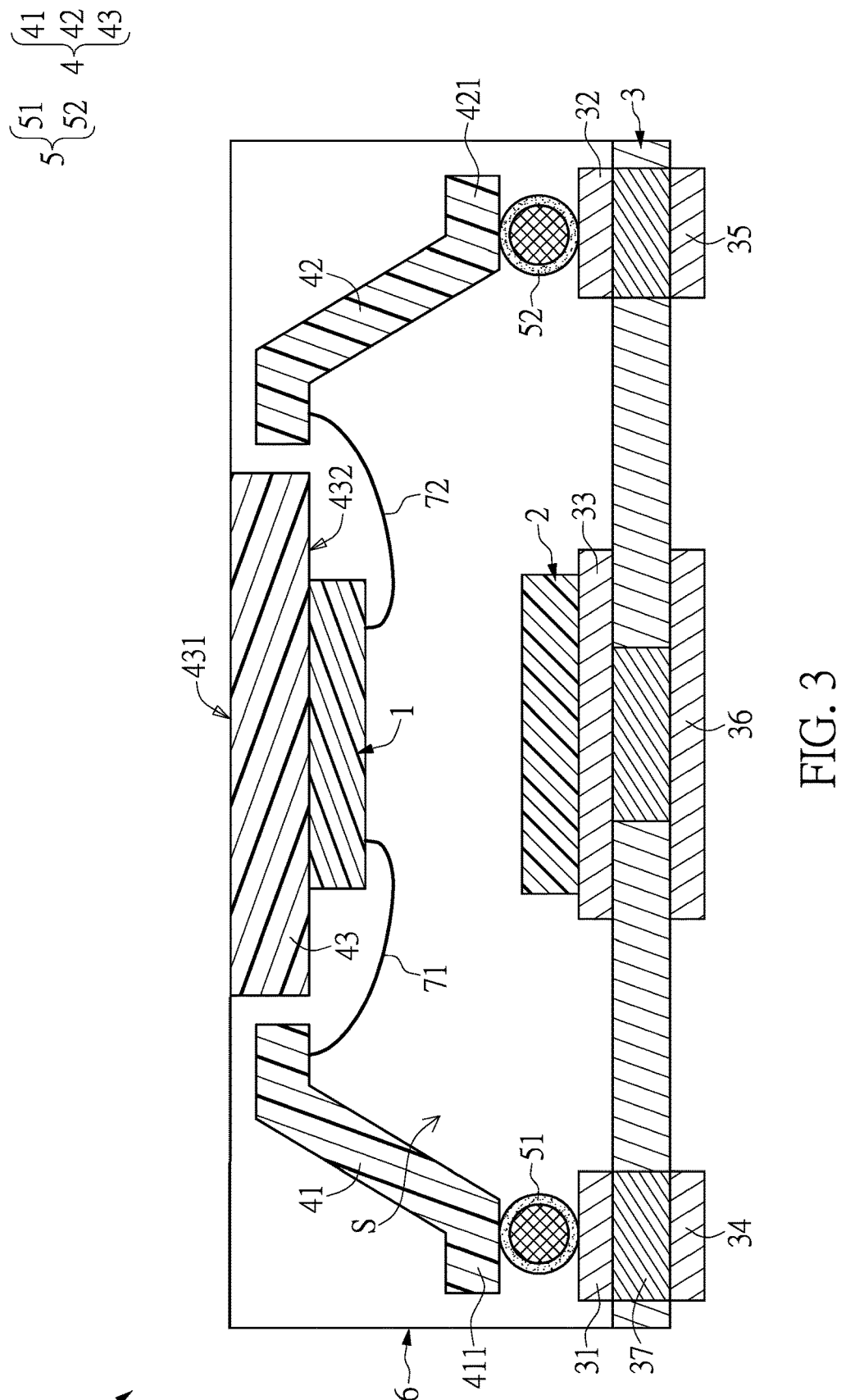
FIG. 3 is a schematic view of a chip package structure according to a third embodiment of the present disclosure.

Referring to FIG. 3, FIG. 3 is a schematic view of a chip package structure according to a third embodiment of the present disclosure. The third embodiment of the present disclosure provides a chip package structure M, which includes a first chip 1, a second chip 2, a circuit substrate 3, a lead frame 4, a connecting member 5, and an package body 6. The chip package structure M in the third embodiment has a structure similar to that of the chip package structure M in the second embodiment, and the similarities therebetween will not be reiterated herein. The main difference between the third embodiment and the second embodiment is that the structure of the circuit substrate 3 is different.

In FIG. 3, the circuit substrate 3 further includes at least one heat dissipating element 37, and the at least one heat dissipating element 37 is embedded into the circuit substrate 3 and contacts one of the plurality of metal pads. A quantity of the heat dissipating element 37 is not limited in the present disclosure. For example, the circuit substrate 3 can include one heat dissipating element 37, which is embedded into the circuit substrate 3 and located between the third metal pad 33 and the sixth metal pad 36. Alternatively, for example, the circuit substrate 3 can include three heat dissipating elements 37, which is embedded into the circuit substrate 3. The three heat dissipating elements 37 are respectively located between the first metal pad 31 and the fourth metal pad 34, between the second metal pad 32 and the fifth metal pad 35, and between the third metal pad 33 and the sixth metal pad 36.

The at least one heat dissipating element 37 is made of ceramic, but the present disclosure is not limited thereto. The heat dissipation efficiency of the chip package structure M can be improved through the design of the at least one heat dissipating element 37 being embedded into the circuit substrate 3. The heat energy that is generated by the second chip 2 can be dissipated through the circuit substrate 3. In addition, the lead frame 4 can also transfer the heat energy from the first chip 1 to the circuit substrate 3 through the first frame 41 and the second frame 42 for further heat dissipation.

Fourth Embodiment

Figure 4:
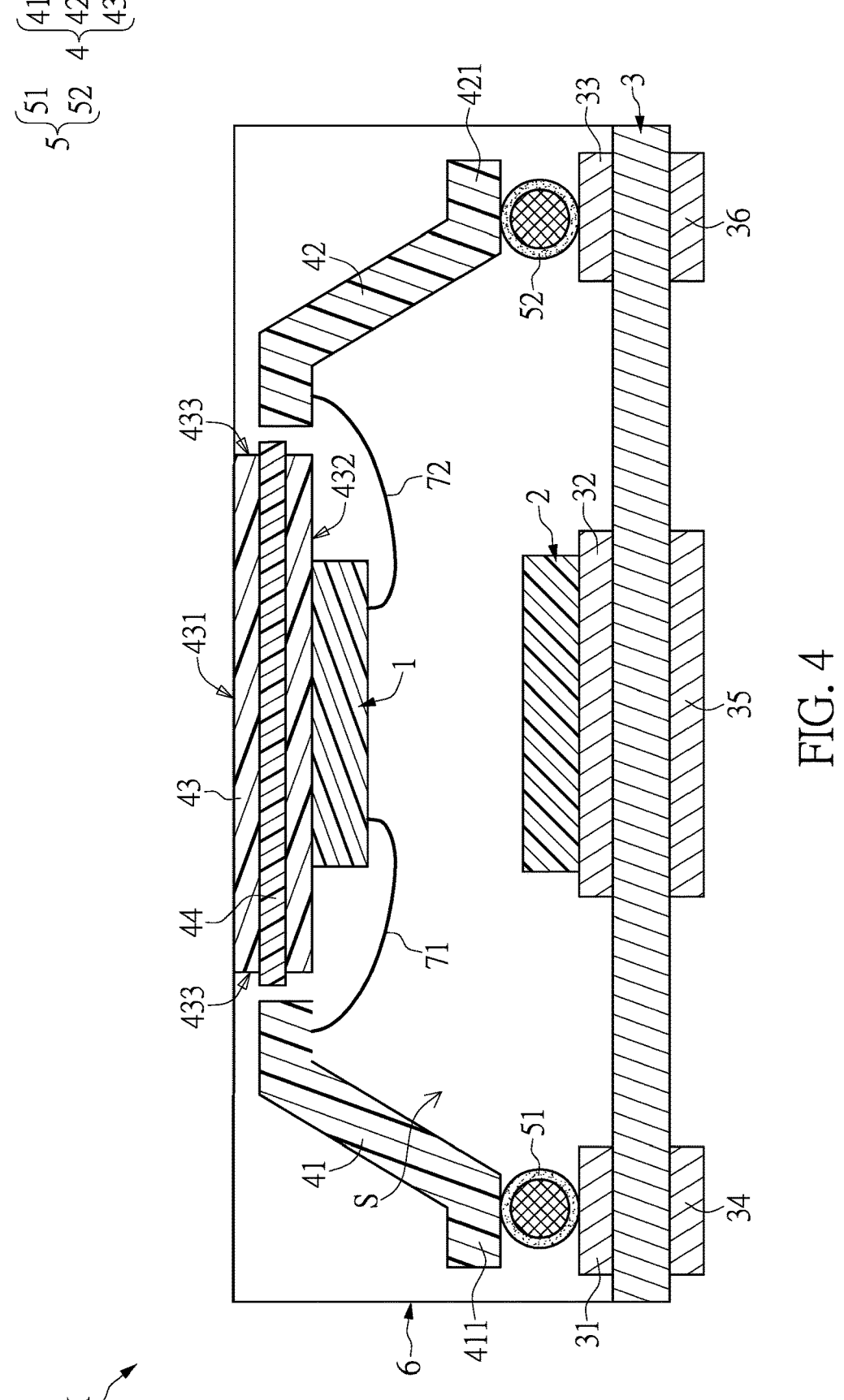
FIG. 4 is a schematic view of a chip package structure according to a fourth embodiment of the present disclosure.

Referring to FIG. 4, FIG. 4 is a schematic view of a chip package structure according to a fourth embodiment of the present disclosure. A fourth embodiment of the present disclosure provides a chip package structure M, which includes a first chip 1, a second chip 2, a circuit substrate 3, a lead frame 4, a connecting member 5, and an package body 6. The chip package structure M in the fourth embodiment has a structure similar to that of the chip package structure M in the second embodiment, and the similarities therebetween will not be reiterated herein. The main difference between the fourth embodiment and the second embodiment is that the structure of the lead frame 4 is different.

In FIG. 4, the lead frame 4 further includes a heat dissipating element 44, which is embedded into the third frame 43. The heat dissipating element 44 can be made of ceramic, but the present disclosure is not limited thereto. Moreover, the heat dissipating element 44 protrudes from both sides 433 of the third frame 43 to increase adhesion strength between the lead frame 4 and the package body 6. Through the design of the heat dissipating element 44 being embedded into the lead frame 4, the heat energy generated by the first chip 1 is dissipated through the third frame 43 and the heat dissipating element 44 therein, and the heat dissipation efficiency of the chip packaging structure M can be further improved.

Fifth Embodiment

Figure 5:
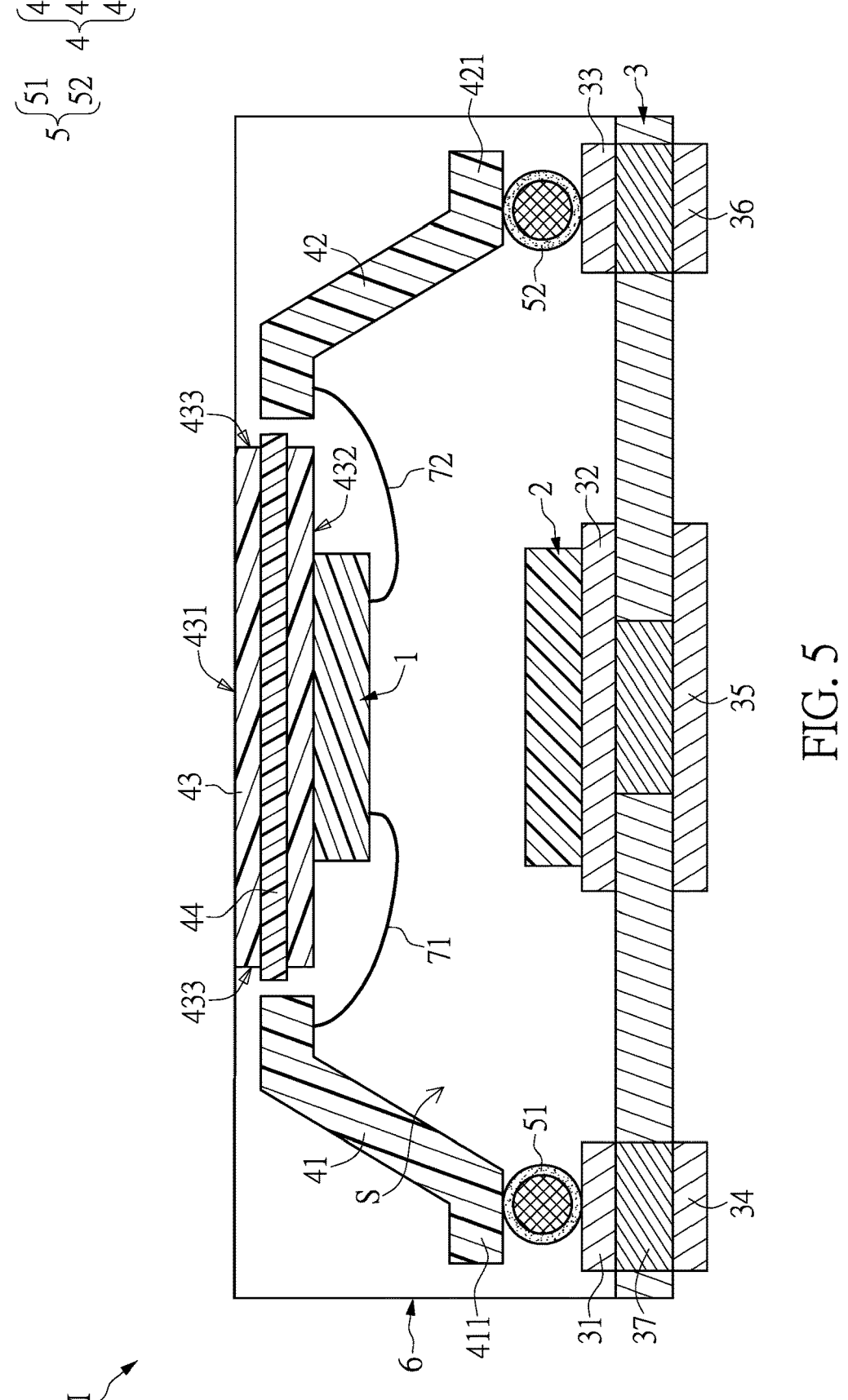
FIG. 5 is a schematic view of a chip package structure according to a fifth embodiment of the present disclosure.
Figure 6:
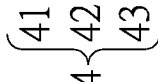
FIG. 6 to FIG. 10 are schematic views of a method of manufacturing the sensor package structure according to the present disclosure.
Figure 6:
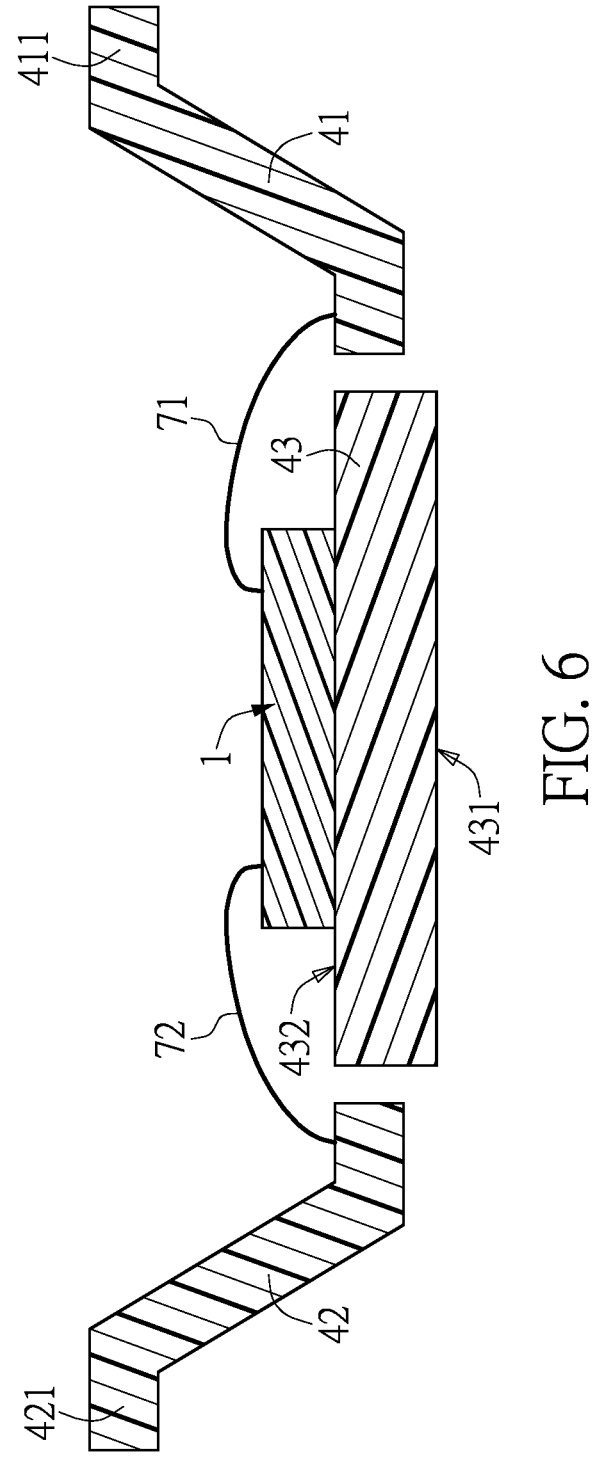
Figure 7:
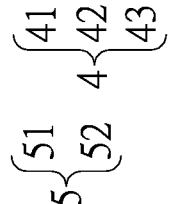
Figure 7:
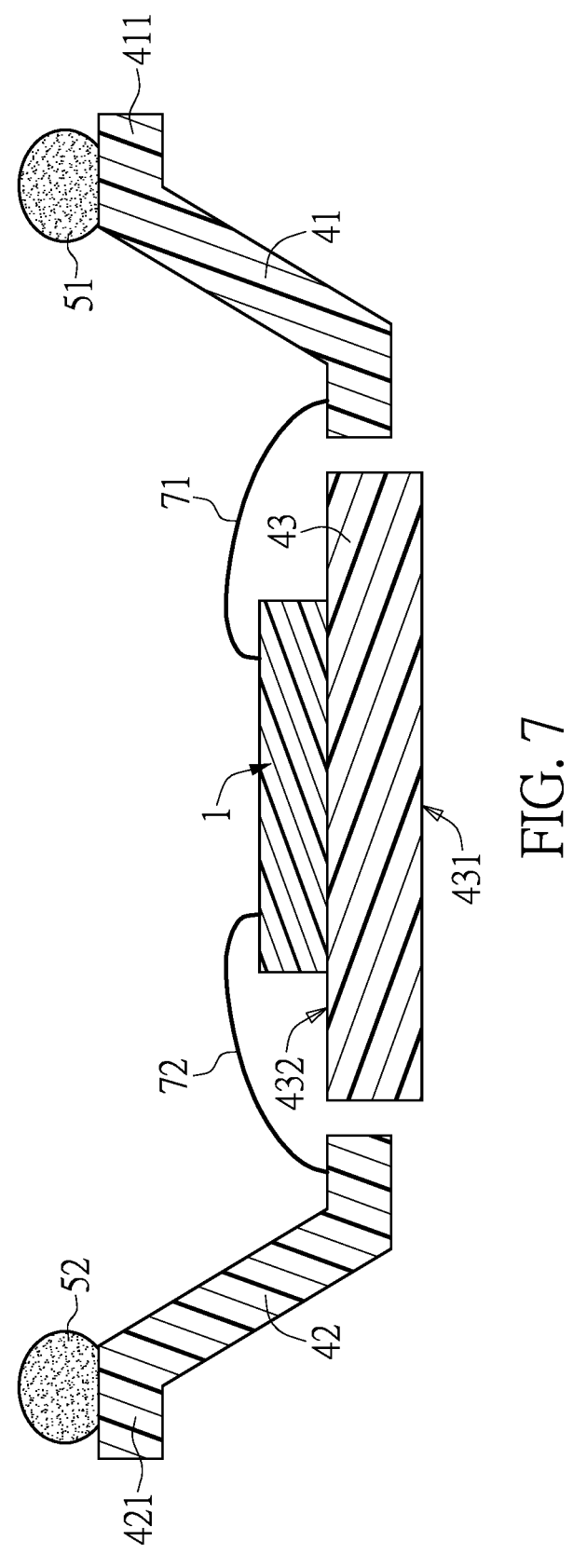
Figure 8:
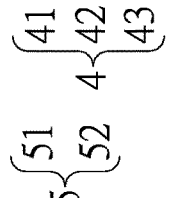
Figure 9:
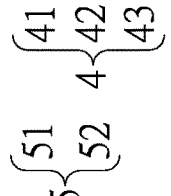
Figure 10:
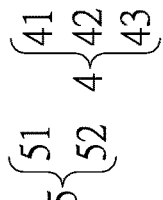

Referring to FIG. 5, FIG. 5 is a schematic view of a chip package structure according to a fifth embodiment of the present disclosure. A fifth embodiment of the present disclosure provides a chip package structure M, which includes a first chip 1, a second chip 2, a circuit substrate 3, a lead frame 4, a connecting member 5, and an package body 6. The chip package structure M in the fifth embodiment has a structure similar to that of the chip package structure M in the fourth embodiment, and the similarities therebetween will not be reiterated herein. The main difference between the fifth embodiment and the fourth embodiment is as follows: the structure of the circuit substrate 3 is different.

Furthermore, the fifth embodiment of the present disclosure is one combination of the third embodiment and the fourth embodiment. In other words, in FIG. 5, the circuit substrate 3 further includes at least one heat dissipating element 37 that is embedded between the upper metal pads and lower metal pads, and the lead frame 4 further includes a heat dissipating element 44 that is embedded in the third frame 43.

The at least one heat dissipating element 37 and the heat dissipating element 44 can be made of ceramic, but the present disclosure is not limited thereto. The efficiency of the heat dissipation efficiency of the chip packaging structure M can be further improved through the at least one heat dissipating element 37 being embedded into the circuit substrate 3, and the dissipating element 44 being embedded into the lead frame 4. The heat energy generated by the second chip 2 can be dissipated through the circuit substrate 3 and the at least one heat dissipating element 37 therein. The heat energy generated by the first chip 1 can be dissipated through the third frame 43 and the heat dissipating element 44 therein.

Sixth Embodiment

Referring to FIG. 6 to FIG. 12, FIG. 6 to FIG. 10 are schematic views of a method of manufacturing the sensor package structure according to the present disclosure, and FIG. 11 and FIG. 12 are flowcharts showing the method of manufacturing the sensor package structure according to the present disclosure. A sixth embodiment of the present disclosure provides a method of manufacturing a chip package structure M, which is suitable for manufacturing of the chip packaging structures M from the first embodiment to the fifth embodiment. The method at least includes the following steps.

Step S11: providing a lead frame 4, the lead frame 4 being bent to form an accommodating space S. The lead frame 4 includes a first frame 41, a second frame 42, and a third frame 43, and the third frame 43 is disposed between the first frame 41 and the second frame 42.

Step S12: placing a first chip 1 on the third frame 43, such that the first chip 1 is located in the accommodating space S.

Step S13: performing a wire bonding process to connect the first chip 1 and the first frame 41 through a first metal wire 71, and connect the first chip 1 and the second frame 42 through a second metal wire 72.

Step S14: placing a first solder 51 on a lead 411 of the lead frame 4, and placing a second solder 52 on a lead 421 of the lead frame 4.

Step S15: providing a circuit substrate 3, the circuit substrate 3 being disposed on the lead frame 4. The circuit substrate 3 includes a first metal pad 31, a second metal pad 32, and a third metal pad 33. The first solder 51 is used to connect the first frame 41 and the first metal pad 31. The second solder 52 is used to connect the second frame 42 and the second metal pad 32. A second chip 2 is placed on the third metal pad 33.

Step S16: providing a package body 6, the package body 6 being disposed on the circuit substrate 3 and covering the first chip 1, the second chip 2, and the lead frame 4.

According to step S11 to step S13, a die bonding process and a wire bonding process are performed. After the lead frame 4 is bent to form an accommodating space S, the first chip 1 (i.e., power IC chip) is placed on the third frame 43. It should be noted that the heat dissipating element 44 shown in FIG. 4 and FIG. 5 can be embedded in the lead frame 4. Moreover, the first metal wire 71 and the second metal wire 72 can be formed by forward bonding or reverse bonding, and is not limited in the present disclosure.

According to step S14 and step S15, a solder dispensing process, a lamination process, and a packaging process are performed. After the first solder 51 and the second solder 52 are disposed on the leads on both sides of the lead frame 4, the circuit substrate 3 is stacked on the lead frame 4 and adhered together through the first solder 51 and the second solder 52. After the circuit substrate 3 and the lead frame 4 are assembled together, the package body 6 covers the first chip 1, the second chip 2, the lead frame 4, the first metal wire 71, and the second metal wire 72, and then the overall structure is inverted to form the chip package structure M.

Beneficial Effects of the Embodiments

In the chip package structure M provided by the present disclosure, by stacking the lead frame 4 on the circuit substrate 3, the lead frame 4 and the circuit substrate 3 are vertically integrated to form a stacked structure. Through the stacked structure, the first chip 1 is disposed on the lead frame 4, and the second chip 2 is disposed on the circuit substrate 3, such that the planar size of the chip package structure M can be reduced. Furthermore, the first chip 1 (power IC chip) and the second chip 2 (driver IC chip) can jointly form a co-package structure through the design of the stacked structure, which can lower the gate-loop inductance and the source inductance in the first chip 1 and the second chip 2 and improve the operating efficiency of the components.

Moreover, the second chip 2 serving as a driver IC chip requires multiple circuit traces, and has a high complexity in circuit layout. Therefore, by disposing the second chip 2 on the circuit substrate 3, the need for a larger circuit layout area can be satisfied. The first chip 1 serving as a power IC chip generates a lot of heat energy because of large current transmission. Therefore, by disposing the first chip 1 on the lead frame 4, the need for high heat dissipation efficiency can be satisfied.

Moreover, the amount of tin between the circuit substrate 3 and the lead frame 4 can be accurately controlled through the design of the first solder 51 and the second solder 52 as copper core solder balls, so as to ensure that the heights on both sides of the lead frame 4 are consistent and avoid tilt caused by uneven tin quantity on either side of the lead frame 4. In addition, the efficiency of the heat dissipation efficiency of the chip packaging structure M can be further improved through the at least one heat dissipating element 37 being embedded into the circuit substrate 3, and the dissipating element 44 being embedded into the lead frame 4.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A chip package structure, comprising:
    a circuit substrate;
    a lead frame stacked on the circuit substrate, wherein the lead frame is bent to form an accommodating space;
    a first chip disposed on the lead frame, wherein the first chip is located in the accommodating space;
    a second chip disposed on the circuit substrate, wherein the second chip is located in the accommodating space;
    a connecting member connected to the lead frame and the circuit substrate; and
    a package body disposed on the circuit substrate, wherein the package body is an integral one-piece structure that embeds the second chip and the lead frame, and an upper surface of the lead frame is partially lower than an upper surface of the package body.

2. The chip package structure according to claim 1, wherein the first chip is a power integrated circuit chip, and the second chip is a driver integrated circuit chip.

3. The chip package structure according to claim 1, wherein the lead frame includes a first frame, a second frame, and a third frame, the third frame is disposed between the first frame and the second frame, the third frame includes an outer surface and an inner surface, the first chip is disposed on the inner surface, and the outer surface is exposed from the package body.

4. The chip package structure according to claim 3, wherein the circuit substrate includes a plurality of metal pads, the plurality of metal pads include a first metal pad, a second metal pad, and a third metal pad, and the second chip is disposed on the third metal pad; wherein the connecting member includes a first solder and a second solder, the first solder is used to connect the first frame and the first metal pad, and the second solder is used to connect the second frame and the second metal pad.

5. The chip package structure according to claim 4, wherein the first solder and the second solder are made of tin.

6. The chip package structure according to claim 4, wherein the first solder and the second solder are made of copper core solder balls.

7. The chip package structure according to claim 3, further including a first metal wire and a second metal wire, wherein the first metal wire is used to connect the first chip and the first frame, and the second metal wire is used to connect the first chip and the second frame.

8. The chip package structure according to claim 4, wherein the lead frame further includes a heat dissipating element, and the heat dissipating element is embedded into the third frame.

9. The chip package structure according to claim 8, wherein the heat dissipating element protrudes from a side of the third frame.

10. The chip package structure according to claim 9, wherein the heat dissipating element is made of ceramic.

11. The chip package structure according to claim 4, wherein the circuit substrate includes at least one heat dissipating element, and the at least one heat dissipating element is embedded into the circuit substrate and contacts one of the metal pads.

12. The chip package structure according to claim 1, wherein the circuit substrate is a laminated printed circuit board structure.

13. The chip package structure according to claim 1, wherein the circuit substrate is made of ceramic.

\* \* \* \* \*